United States Patent
Muhlfeld et al.

(12) 
(10) Patent No.: US 6,697,258 B1
(45) Date of Patent: Feb. 24, 2004

(54) MOISTURE-RESISTANT ENCLOSURE FOR ELECTRONIC CIRCUITRY

(75) Inventors: David E. Muhlfeld, Earlville, NY (US); Augustus R. Baldini, Binhamton, NY (US)

(73) Assignee: The Raymond Corporation, Greene, NY (US)

( * ) Notice: Subject to any disclaimer, the term of this patent is extended or adjusted under 35 U.S.C. 154(b) by 0 days.

(21) Appl. No.: 10/279,516

(22) Filed: Oct. 24, 2002

(51) Int. Cl.[7] .................................................. H05K 7/00
(52) U.S. Cl. ...................... 361/729; 361/756; 361/797; 361/800; 361/686; 439/377
(58) Field of Search ................................ 361/752, 724, 361/714, 797, 800, 796, 756, 727, 741, 686, 802; 439/377

(56) References Cited

U.S. PATENT DOCUMENTS

| | | | |
|---|---|---|---|
| 3,851,294 | A | 11/1974 | Palazzetti et al. |
| 4,103,318 | A | 7/1978 | Schwede |
| 4,216,576 | A | 8/1980 | Ammon et al. |
| 4,251,853 | A * | 2/1981 | Sites ........................... 361/732 |
| 4,471,898 | A * | 9/1984 | Parker ....................... 228/20.5 |
| 4,656,559 | A * | 4/1987 | Fathi ........................... 361/721 |
| 4,781,621 | A | 11/1988 | Sugiyama et al. |
| 4,977,482 | A | 12/1990 | Langdon et al. |
| 5,102,342 | A | 4/1992 | Marian |
| 5,282,099 | A | 1/1994 | Kawagoe et al. |
| 5,309,315 | A | 5/1994 | Naedel et al. |
| 5,313,729 | A | 5/1994 | Sakai et al. |
| 5,337,202 | A | 8/1994 | Jabbarai et al. |
| 5,483,423 | A * | 1/1996 | Lewis et al. ................ 361/816 |
| 5,508,860 | A | 4/1996 | Takagi et al. |
| 5,530,623 | A * | 6/1996 | Sanwo et al. ............... 361/788 |
| 5,621,617 | A | 4/1997 | Goss et al. |
| 5,667,393 | A | 9/1997 | Grabbe et al. |
| 5,844,781 | A | 12/1998 | Schlotterer et al. |
| 5,896,268 | A | 4/1999 | Beavers |
| 6,036,525 | A | 3/2000 | Alfis, III |
| 6,139,361 | A | 10/2000 | Przilas et al. |
| 6,168,459 | B1 | 1/2001 | Cox et al. |
| 6,219,258 | B1 | 4/2001 | Denzene et al. |

* cited by examiner

*Primary Examiner*—Randy Gibson
*Assistant Examiner*—Hung Bui
(74) *Attorney, Agent, or Firm*—Quarles & Brady LLP

(57) ABSTRACT

An enclosure for electronic circuitry includes a container that is formed to define an enclosed volume. An open end of the container is sealed by a printed circuit board which also provides electrical connection to the enclosed electronic circuitry by means of connectors mounted to its inside and outside surface.

24 Claims, 4 Drawing Sheets

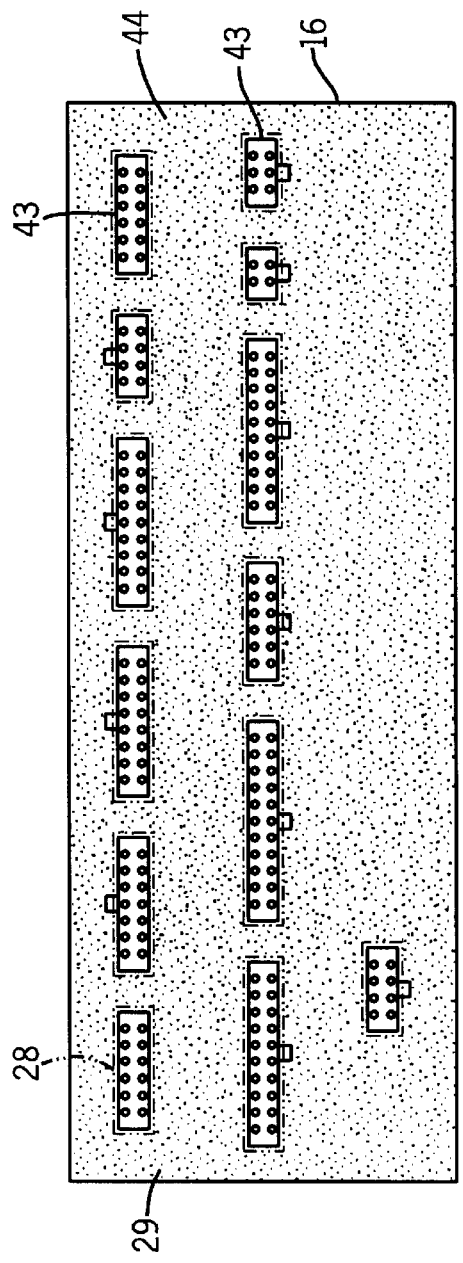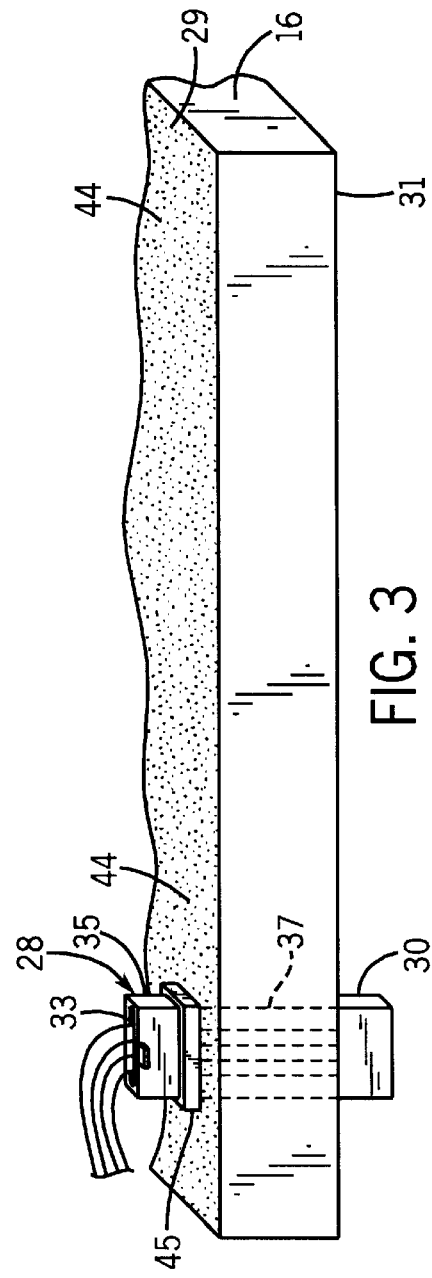

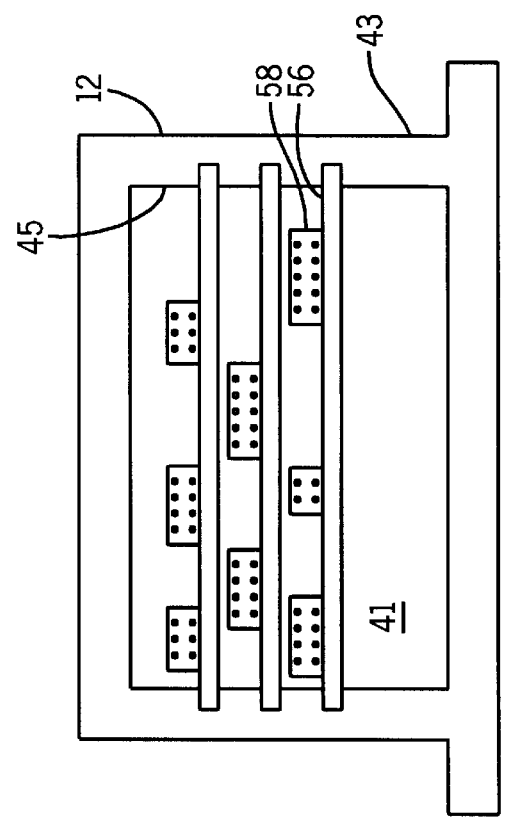
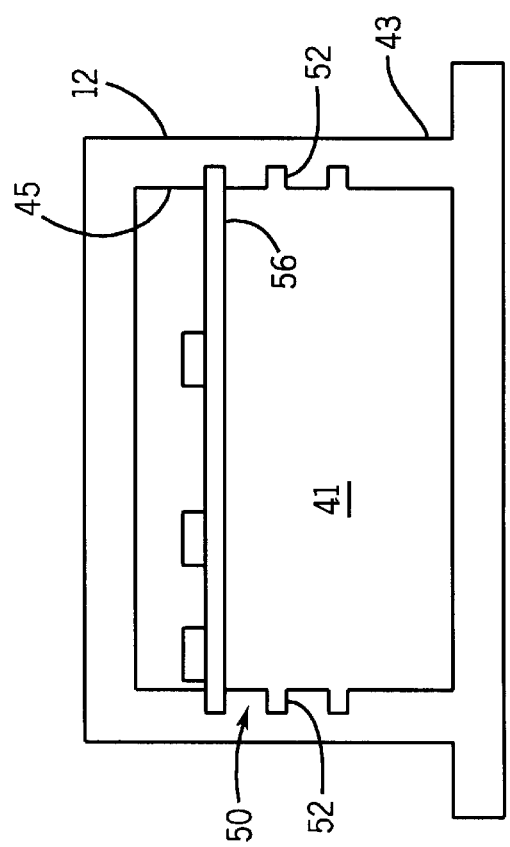

US 6,697,258 B1

MOISTURE-RESISTANT ENCLOSURE FOR ELECTRONIC CIRCUITRY

FIELD OF THE INVENTION

The present invention relates to an enclosure for electronics suitable for use in a hostile environment, and, more particularly, to a sealed electronic enclosure including a printed circuit board as a structural element.

BACKGROUND

Complex electronic systems which control the engine, fuel system, braking, and steering systems of vehicles are increasingly common in control systems of motor vehicles. For logistical reasons, electronic systems of this type are typically stored in the engine compartment of the vehicle, in reasonably close proximity to the systems which they control. This configuration assures that wiring of the components is relatively easy and that leads are relatively short. While positioning of the electronic components in the engine compartment is convenient, however, there are a number of problems associated with storing electrical circuitry in this environment. In particular, the engine compartment is open to hostile environmental conditions including salt spray, wetness, high humidity, and temperature extremes which can be problematic for electronic circuitry. Electronic circuitry, therefore, is prone to premature failure when stored under these conditions.

To protect the electronic components from hostile weather and temperature conditions, electronic components and circuit boards are typically stored in an enclosure constructed from a moisture-resistant material. Connections to the external environment are made through holes in the enclosure through which individual wires can be routed, or in which connectors to the internal circuitry are mounted. The individual wires and/or connectors are typically mounted on a circuit board, which is mounted behind a wall of the enclosure. The circuit board is sealed to the wall of the enclosure using a number of sealing devices including rubber gaskets positioned between the board and the wall of the enclosure, and silicone sealants provided between each of the connectors on the printed circuit board and the wall of the enclosure. The gaskets and other sealants are provided to prevent moisture from entering the enclosure through the interface between the board and the enclosure walls, and through holes in the board. This would be required with any type of standard cover.

While electronic enclosures of this type are generally effective for protecting the enclosed electronic circuitry, these enclosures add unnecessary parts, manufacturing costs and complexity. For example, to properly provide a seal between the underlying board and the enclosure, the silicone sealants must be added after the board is mounted to the wall of the enclosure. Sealing is therefore a difficult, labor intensive and time consuming process. Further, even when done carefully, sealants added between assembled components vary significantly in quality from part-to-part and often provide an insufficient seal to prevent moisture leakage. Additionally, positioning and tightening a gasket in place between the printed circuit board and the wall of the enclosure can also be difficult when the enclosure is assembled in this way, particularly since the gasket is often positioned where it cannot be readily seen during assembly. There remains a need, therefore, for an enclosure for electronic equipment which is moisture-resistant, and both inexpensive and easy to manufacture.

SUMMARY OF THE INVENTION

The present invention is an enclosure for electronic circuitry comprising a container which defines a volume for housing the electronic circuitry and having an opening therein for communicating with the surrounding environment; a printed circuit board mounted to the container and covering the opening to the circuitry and sealing it off from the surrounding environment; a first electrical connector mounted to the inside surface of the printed circuit board to provide an electrical connection with the enclosed electronic circuitry; a second electrical connector mounted to the outside surface of the printed circuit board to provide electrical connections to external circuitry; and wherein the printed circuit board includes conductors that electrically connect the first and second electrical connectors.

A general object of the invention is to provide an inexpensive enclosure for electronic circuitry which protects the circuitry from the environment. By covering the open end of the enclosure with a printed circuit board having connectors on both sides, the electronic circuitry can be electrically connected to external circuits without the need for separate sealed openings that can leak and may require additional manufacturing steps.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 2 is a top view of the printed circuit board of FIG. 1 before components are inserted;

FIG. 3 is a plan view of the circuit card of FIG. 1 with the components inserted;

FIG. 4 is a top view of the container of FIG. 2; and

FIG. 5 is a top view of the container of FIG. 2 with circuit boards enclosed.

DETAILED DESCRIPTION OF THE PREFERRED EMBODIMENT

Figure 1:
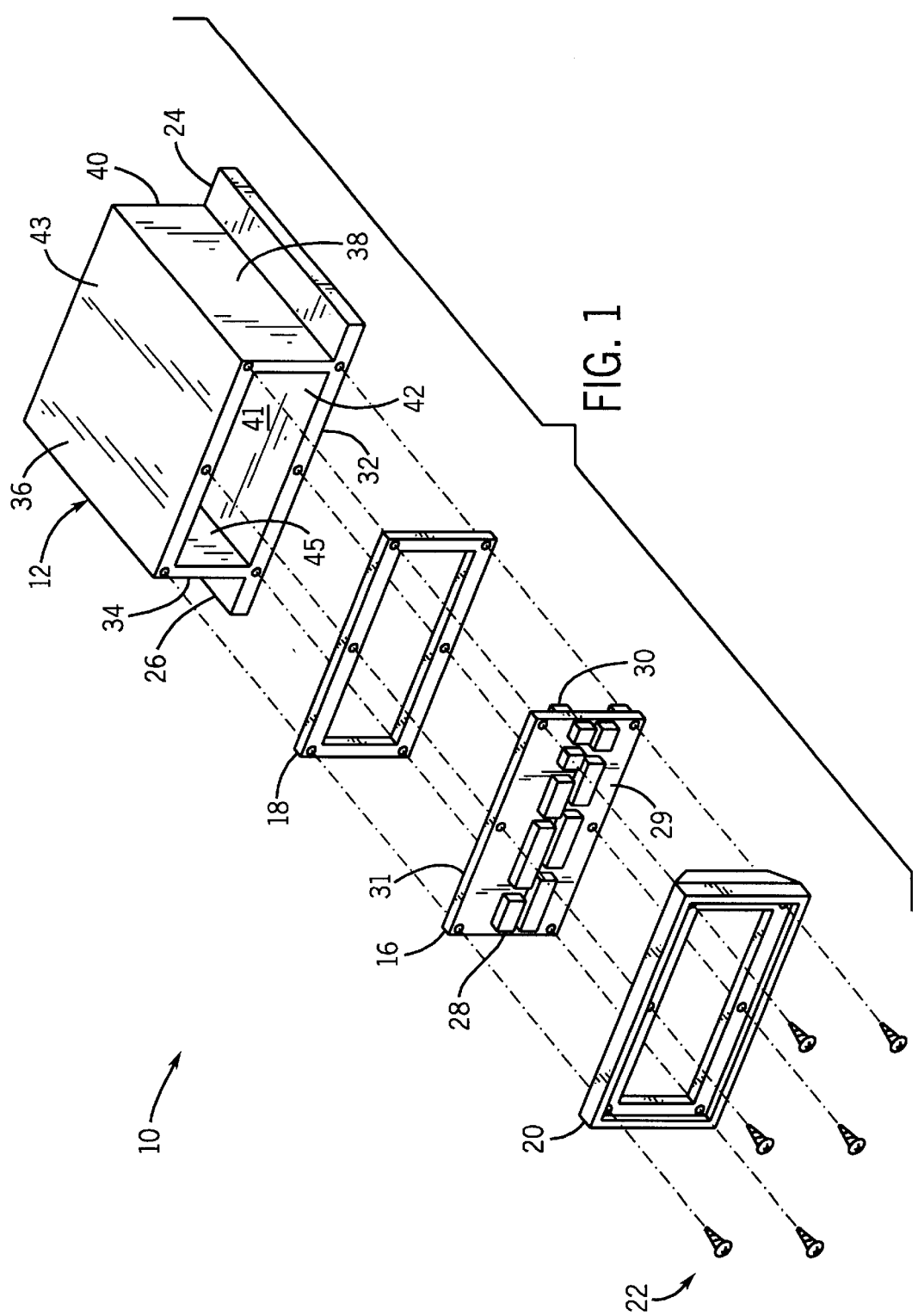
FIG. 1 is an exploded view of an electronic enclosure constructed in accordance with the present invention.

Referring now to the figures and more particularly to FIGS. 1 and 4 an exploded view of an electronics enclosure 10 constructed in accordance with the present invention is shown. The electronics enclosure 10 generally comprises an open-ended container 12 and a printed circuit card 16. Electronic circuitry, typically one or more circuit board 56, is provided in an internal volume 41 of the container 12, and wiring from the internal circuit board 56 is routed to one or more connector 30 on the circuit board 16. The printed circuit card 16 is sized and dimensioned to enclose the opening 42 in the container 12, and is mounted to the container 12 over the opening 42 to provide a structural, sealing, and electrical element of the enclosure 10, as described more fully below.

Referring still to FIG. 1, the container 12 is constructed of a moisture and corrosion-resistant material configured to provide an outer surface 43 and inner surface 45. The inner surface 45 defines the interior volume 41 for housing electronic circuitry. As shown in FIG. 1, the container 12 can be rectangular, comprising four side walls 32, 34, 36, and 38; an enclosed end wall (not shown); and an opening 42. The container 12, however, can be provided in various shapes and configurations. Preferably, the container 12 is constructed of an aluminum extrusion or molded plastic. However, any corrosion and moisture-resistant material can be used. Mounting structures, such as the flanges 24 and 26, can be provided for mounting the container 12 inside an engine compartment or external housing.

Referring now to FIGS. 1 and 4 the internal volume 41 of the open-ended container 12 is sized and dimensioned to receive one or more printed circuit board 56 which are internally mounted to the inside surface 45 of the container 12. Referring now specifically to FIG. 4, the container 12 is shown to include a circuit card rack 50 for receiving internal printed circuit cards 56 which are slid into slots 52 of the rack 50. Alternatively, the internal printed circuit board or boards 56 can be mounted to the side of the container 12 with standoffs and threaded fasteners, or using other conventional circuit card mounting techniques. Furthermore, electrical circuitry can be mounted directly to the walls of the container 12 rather than provided on circuit boards. Other methods of mounting electrical circuits inside the containers 12 will be apparent to those of ordinary skill in the art.

Referring again to FIG. 1, the printed circuit board 16 used to seal the container 12 is preferably a double-sided circuit board including one or more electrical connector 28 on an external surface 29 of the board 16 and one or more electrical connector 30 on an internal surface 31 of the board 16. Electrical communications between the electrical circuitry housed in the enclosure 10 and external circuitry are provided through the connectors 28 and 30, and are routed between the connectors 28 and 30 through conductive runs 37 (FIG. 3) on the printed circuit board 16. Although the printed circuit board 16 is shown to include only electrical connectors, electrical circuit components can also be provided on an inside surface of the printed circuit board 16. Furthermore, the printed circuit board 16 can also be a single sided or multi-layered board. An internal layer or layers in the printed circuit board can be designed to provide an electromagnetic shield, hereby increasing the integrity of the enclosure to RF interference.

Referring now to FIG. 2, the printed circuit board 16 is shown prior to the insertion of the connectors 28 and 30. The printed circuit board 16 is coated with a conformal coating 44 which prevents environmental damage to the printed circuit board 16 and prevents moisture from entering the container 12. The conformal coating 44 is applied to the printed circuit board 16 to maximize coverage of the exposed board area, and to provide an environmental barrier protecting exposed circuit traces from moisture and other detrimental environmental conditioning. To maximize protection, the conformal coating is applied to extend beneath the plastic housings of the connectors 28 and 30 as shown by line 43 of FIG. 2. The conformal coating 44 then acts in conjunction with a sealant 31 (FIG. 3), described below, to seal off the connectors 28 and 30. Typical moisture-resistant conformal coatings useful in the present application include silicone, acrylic, and urethane.

Referring now to FIG. 3, the connectors 28 and 30 are typical board mount electrical connectors including conductive pins or sockets 33 housed in a plastic outer housing 35. Connectors of this type include, for example, the Amp Universal Mate 'n Lock produced by the Tyco Electronics Corp. of Harrisburg, Pa. The connectors 28 and 30 are inserted into the board and soldered before it is coated with the conformal coating 44. Using conventional vapor-phase reflow solder techniques, the external connectors, and internal connectors and any internal-side components, can all be soldered simultaneously. The solder process provides a moisture-impregnable barrier on both sides of the through holes. If required, the connectors can be further sealed to the board by applying a room temperature vulcanizing (RTV) silicone or other sealant material 31 at the interface between the printed circuit board 16 and the plastic housing of the connectors 28 and 30. The optional sealant material 31 and the conformal coating 44 therefore seal off the underside of the connectors 28 and 30 from moisture found on the printed circuit board 16 and in the external environment. For additional moisture resistance, the connectors 28 and 30 can be sealed connectors which are specifically designed to prevent or minimize the flow of water or other fluids through the connector. Suitable sealed connectors, for example, include the Amp Econoseal J Series of connectors also produced by Tyco Electronics Corp. of Harrisburg, Pa. which provide a water proof connection and include cavity plugs for plugging unused contact cavities. Other suitable commercial sealed connectors are also available.

Referring again to FIG. 1, the printed circuit card 16 is preferably coupled to the container 12 through a gasket 18. The gasket 18 comprises a moisture-resistant sealing material such as rubber or flexible plastic and is sized and dimensioned to substantially cover the surface of the open end 42 of the container 12, and therefore to provide a moisture-resistant interface between the container 12 and the printed circuit board 16. Referring again to FIG. 1, a bezel 20, sized and dimensioned to frame the outer edge of the printed circuit board 16 leaving access to the connector 28 open, is optionally mounted on the outer edge of the board 16. The bezel 20 is constructed from a stiff inflexible material to provide a clamping force on the board 16 and gasket 18, thereby providing a tight seal between the board 16 and gasket 18, and is preferably sized and dimensioned to have substantially the same dimensions as the gasket 18. The bezel 20 is particularly useful when the printed circuit board 16 is constructed from a flexible substrate material, preventing the printed circuit board from blocking and loosening the seal to the gasket 18 when external, vibrational or other forces are applied.

Referring again to FIG. 1, as assembled, the electronic enclosure 10 is enclosed at the open end 42 of the container 12 by the gasket 18, printed circuit card 16, and bezel 20, each of which are coupled to mounting holes in the open end 42 of the container 12 with a series of threaded fasteners 22. As noted above the printed circuit board 16 is sized and dimensioned to enclose the opening 42 of the container 12. The bezel 20 provides a clamping force on the printed circuit board 16 and gasket 18 to provide a tight interface between the circuit board 16 and container 12, such that the seal minimizes or prevents moisture from entering the open-ended container 12. When provided over the opening 42, the printed circuit board 16 is a structural member of the enclosure 10. The printed circuit board 16 is sealed to the container 12 such that the enclosure 10 is moisture-resistant, and the internal circuit boards 56 are maintained in a dry environment. The printed circuit board 16 further provides a connection point for communicating electrical signals to and from the circuit boards 56 in the enclosure 10. The printed circuit board 16 therefore is a structural member of the enclosure 10, a sealing member of the enclosure 10, and an electrical member, providing a path for communicating signals to and from the enclosure 10.

Figure 6:
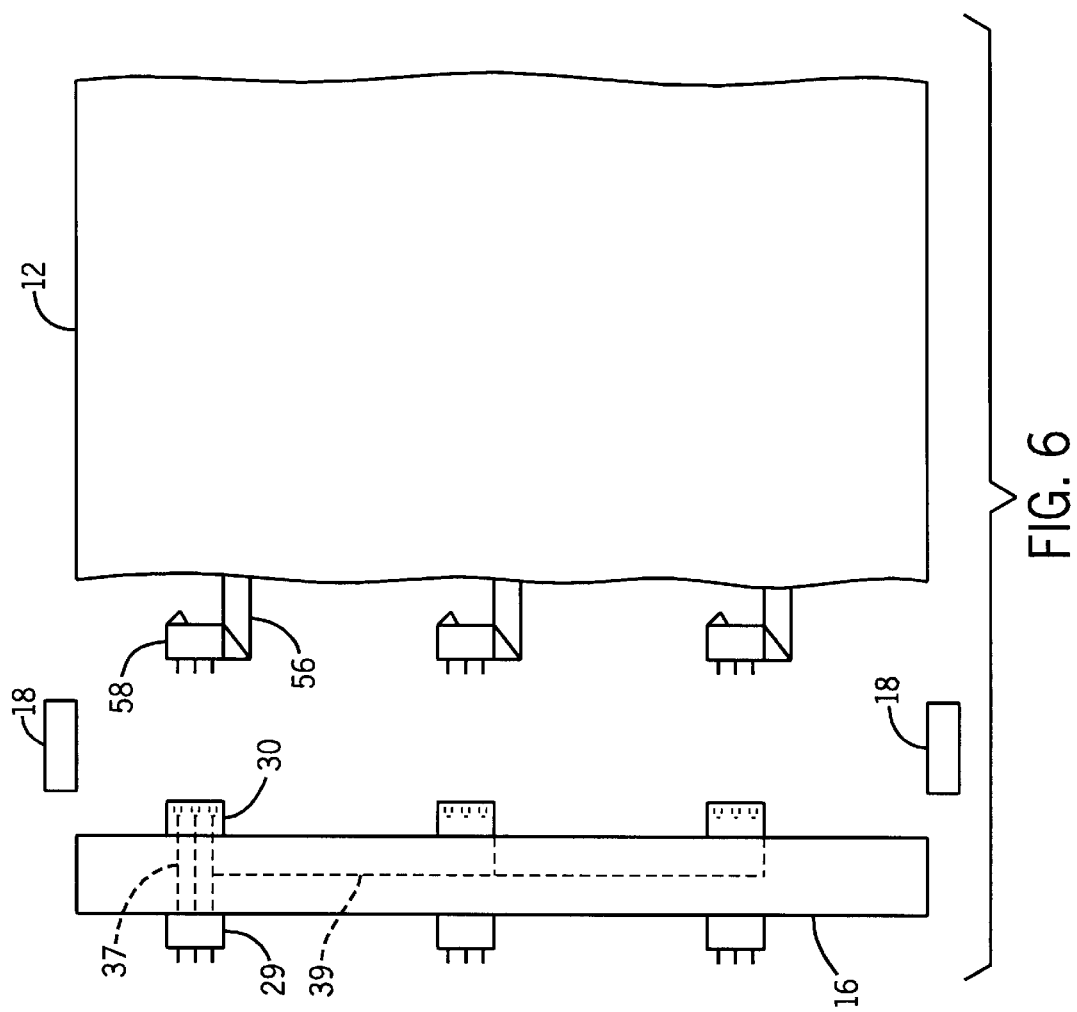
FIG. 6 is a cutaway side view of the container of FIG. 2 illustrating the insertion of the use of a mother board to cover the open end of the enclosure.

Referring now to FIGS. 5, and 6 a second embodiment of the invention is shown wherein the printed circuit board 16 serves as a motherboard to the internal circuitry in the enclosure 10. Referring first to FIG. 5, the container 12 includes one or more internal circuit card 56 mounted in a card rack 50 of container 12, as described above. The printed circuit boards 56 includes connectors 58 which are directed toward the opening 42 in the container 12, and disposed on the boards 56 such that the connective pins and/or sockets mate directly with matching connectors 28 on the printed circuit board 16 as shown in FIG. 6. In this embodiment, therefore, wiring between the internal circuit boards 56 and printed circuit board 16 is provided through conductive runs 37, 39 on the printed circuit board 16. The printed circuit board 16 acts as a motherboard and additional wiring is therefore not required. Alternatively, the inside connectors can provide connection to a wire harness, for connection to internal circuitry.

It should be understood that the methods and apparatuses described above are only exemplary and do not limit the scope of the invention, and that various modifications could be made by those skilled in the art that would fall under the scope of the invention. For example, although the enclosure 10 has been described as having one wall enclosed by a printed circuit board, it will be apparent that a number of walls could be constructed in the same way. Furthermore, although a specific rectangular structure has been shown and described, a number of different structural shapes could be employed within the scope of the invention. Additionally various types of connectors and conformal coatings can be used in the construction of the printed circuit board. To apprise the public of the scope of this invention, the following claims are made:

We claim:

1. An enclosure for electronic circuitry, the enclosure comprising:
    a container having walls which defines a volume for housing the electronic circuitry and which isolate the electronic circuitry from the surrounding environment except for an opening therein for communicating with the surrounding environment;
    a printed circuit board mounted to the container and covering the opening to the circuitry and sealing the volume of the container from the surrounding environment;
    a first electrical connector mounted to the inside surface of the printed circuit board to provide an electrical connection with the enclosed electronic circuitry;
    a second electrical connector mounted to the outside surface of the printed circuit board to provide electrical connections to external circuitry; and
    wherein the printed circuit board includes conductors that electrically connect the first and second electrical connectors.

2. The enclosure as defined in claim 1, wherein the printed circuit board includes a conformal coating for sealing the printed circuit board from the environment.

3. The enclosure as defined in claim 1, further comprising a gasket disposed between the printed circuit board and the container to provide a seal for preventing moisture from entering the container.

4. The enclosure as defined in claim 1, further comprising a bezel mounted to the external side of the printed circuit board, the bezel providing a clamping force on the printed circuit board to tighten a seal formed between the printed circuit board and the container.

5. The enclosure as defined in claim 1, wherein each of the connectors includes an internal seal for preventing moisture from entering the container.

6. The enclosure as defined in claim 1, wherein the container is formed from a moisture-resistant material.

7. The enclosure as defined in claim 1, wherein the container comprises a molded plastic.

8. The enclosure as defined in claim 1, wherein the container comprises an aluminum extrusion.

9. The enclosure as defined in claim 1, wherein the container includes a card rack defined by slots formed on two opposing internal surfaces of the container and a plurality of internal circuit boards are mounted in the container by the card rack.

10. The enclosure as defined in claim 9 which includes a plurality of said first electrical connectors mounted to the inside surface of said printed circuit board; and in which each of the plurality of internal circuit boards electrically connect to respective ones of said first electrical connectors.

11. The enclosure as defined in claim 10 which includes additional conductors formed on the printed circuit board that electrically interconnect said plurality of first electrical connectors.

12. The container as defined in claim 1, wherein a sealant is provided at an interface between the printed circuit board and each of the first and second electrical connectors.

13. An enclosure for electronic circuitry, the enclosure comprising:
    a container having walls which define a volume for housing the electronic circuitry and which isolate the electronic circuitry from the surrounding environment except for an opening therein for communicating with the surrounding environment;
    a seal mounted to an edge of the container surrounding the opening, the seal preventing moisture from entering the container;
    a printed circuit board mounted on the seal and connected to the edge of the container and covering the opening to the circuitry and sealing it off from the surrounding environment;
    a first electrical connector mounted to the inside surface of printed circuit board to provide an electrical connection with the enclosed electronic circuitry;
    a second electrical connector mounted to the outside surface of the printed circuit board to provide electrical connections to external circuitry; and
    conductors formed on the printed circuit board that electrically connect the first and second electrical connectors.

14. The enclosure as defined in claim 11, further comprising a bezel coupled to the printed circuit board, the bezel providing a clamping force on the printed circuit board and the seal.

15. The enclosure as defined in claim 11, wherein the seal comprises a rubber or other material.

16. The enclosure as defined in claim 11, wherein the printed circuit board comprises a conformal coating, the conformal coating extending beneath the housings of the first and second connectors to prevent moisture from reaching a through-hole in the printed circuit board.

17. The enclosure as defined in claim 11, further comprising a sealant applied at the interface between each of the first and second connectors and the printed circuit board.

18. The enclosure as defined in claim 11, wherein the printed circuit board comprises a mother board.

19. An enclosure for housing a plurality of internal circuit boards, the enclosure comprising:
- a container having walls which define a volume for housing the internal circuit boards and which isolate the electronic circuitry from the surrounding environment except for an opening therein for communicating with the surrounding environment;
- a printed circuit board mounted to the container and covering the opening to the circuitry and sealing the volume of the container off from the surrounding environment;
- a plurality of internal electrical connectors mounted to the inside surface of the printed circuit board to provide an electrical connection with the internal circuit boards;
- a second electrical connector mounted to the outside surface of the printed circuit board to provide electrical connections to external circuitry; and
- wherein the printed circuit board includes conductors that electrically connect the first and second electrical connectors and conductors that electrically interconnect said first plurality of first electrical connectors to provide interconnections between the internal circuit boards.

20. The enclosure as defined in claim 19, further comprising a card rack inside of the volume for mounting the internal circuit boards.

21. The enclosure as defined in claim 20, wherein the card rack comprises a plurality of slots formed in an internal surface of the container.

22. The enclosure as defined in claim 19, wherein:
- each of the plurality of internal circuit boards includes at least one electrical connector that is directed toward the opening in the enclosure, and the electrical connector mates directly with the plurality of internal connectors of the printed circuit board mounted to the container.

23. The enclosure as defined in claim 19, further comprising a gasket disposed between the printed circuit board and the container to provide a seal for preventing moisture from entering the container.

24. The enclosure as defined in claim 19, wherein the printed circuit board comprises a multi-layer board and at least one of the layers comprises an electromagnetic shield for minimizing electromagnetic interference.

* * * * *